(12) United States Patent
Di Matteo

(10) Patent No.: US 12,123,901 B2
(45) Date of Patent: Oct. 22, 2024

(54) SYSTEM FOR CHECKING THE PERFORMANCE OF ENERGY AND MONITORING PHOTOVOLTAIC SOLAR OR WIND PLANTS

(71) Applicants: Nicola Raffaele Di Matteo, Marano Lagunare (IT); SUNREPORT S.R.L., Villesse (IT)

(72) Inventor: Nicola Raffaele Di Matteo, Marano Lagunare (IT)

(73) Assignees: SUNREPORT S.R.L., Villesse (IT); Nicola DiMatteo, Marano Lagunare (IT)

(*) Notice: Subject to any disclaimer, the term of this patent is extended or adjusted under 35 U.S.C. 154(b) by 360 days.

(21) Appl. No.: 15/768,540

(22) PCT Filed: Oct. 14, 2016

(86) PCT No.: PCT/IB2016/056149
§ 371 (c)(1),
(2) Date: Apr. 14, 2018

(87) PCT Pub. No.: WO2017/064650
PCT Pub. Date: Apr. 20, 2017

(65) Prior Publication Data
US 2018/0306847 A1  Oct. 25, 2018

(30) Foreign Application Priority Data

Oct. 14, 2015  (IT) .......................... UB2015A004649

(51) Int. Cl.
*G06Q 50/06* (2024.01)
*F03D 17/00* (2016.01)
(Continued)

(52) U.S. Cl.
CPC ............ *G01R 22/061* (2013.01); *F03D 17/00* (2016.05); *G01R 21/133* (2013.01); *G01W 1/10* (2013.01);
(Continued)

(58) Field of Classification Search
CPC ..... G01R 22/061; G01R 21/133; F03D 17/00; H04W 4/38; G01W 1/10; G06Q 50/06; H02S 50/00
(Continued)

(56) References Cited

U.S. PATENT DOCUMENTS

2009/0309754 A1* 12/2009 Bou ....................... G01R 15/18
340/870.02
2010/0080175 A1* 4/2010 Kang ...................... H04L 41/32
370/328

(Continued)

FOREIGN PATENT DOCUMENTS

EP          2858015 A1      4/2015

OTHER PUBLICATIONS

Laird, What is LoRa (Year: 2015).*
(Continued)

*Primary Examiner* — Mohamed Charioui
*Assistant Examiner* — Dacthang P Ngo
(74) *Attorney, Agent, or Firm* — Kristina Castellano; CASTELLANO PLLC

(57) ABSTRACT

The invention allows verifying the performance of energy over time of any photovoltaic or wind solar plants whose value of energy produced is made available on computers accessible through a public data communication network and monitoring the operation thereof. Energy production values of a plant over time (even from the plant start up) are collected by computers connected to the Internet public network which present them in a hypertext structure of (Continued)

accessible documents, the current ones from an energy meter inserted downstream of the plant and the historical and current weather ones from computers also connected to the Internet public network. The result obtained is the automatic production, i.e. in almost zero processing time, of operating reports that include the energy produced, the revenues and a performance index over time with energy performance measurements, graphs, analysis and alerts of photovoltaic solar and wind plants.

4 Claims, 1 Drawing Sheet

(51) Int. Cl.
G01R 21/133 (2006.01)
G01R 22/06 (2006.01)
G01W 1/10 (2006.01)
H02S 50/00 (2014.01)
H04W 4/38 (2018.01)

(52) U.S. Cl.
CPC ............ *G06Q 50/06* (2013.01); *H02S 50/00* (2013.01); *H04W 4/38* (2018.02)

(58) Field of Classification Search
USPC .......................................................... 702/62
See application file for complete search history.

(56) References Cited

U.S. PATENT DOCUMENTS

2010/0318233 A1* 12/2010 Yunes ................. H02J 3/383
  700/287
2013/0085885 A1    4/2013 Sahai et al.
2014/0188410 A1    7/2014 Kerrigan et al.
2016/0190984 A1*  6/2016 Caine ................. H02S 50/00
  702/60

OTHER PUBLICATIONS

Texas Instruments, 6LoWPAN demystified (Year: 2014).*
International Search Report and Written Opinion dated Apr. 20, 2017, in International application PCT/IB2016/056149.

* cited by examiner

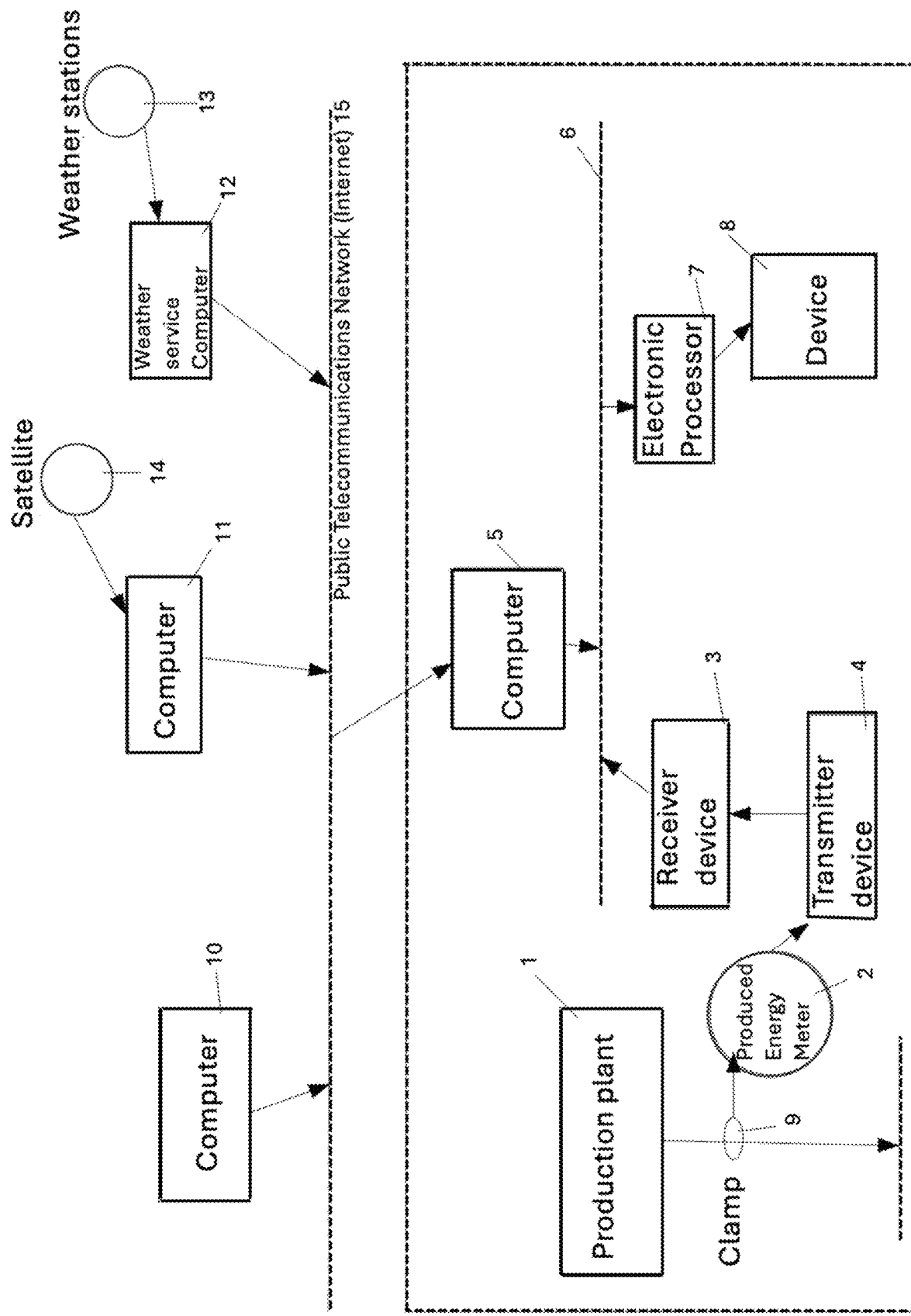

SYSTEM FOR CHECKING THE PERFORMANCE OF ENERGY AND MONITORING PHOTOVOLTAIC SOLAR OR WIND PLANTS

CROSS REFERENCE TO RELATED APPLICATIONS

This is a U.S. National Stage application of PCT/IB2016/056149 filed on Oct. 14, 2016, which claims priority to Italian patent application UB2015A004649 filed on Oct. 14, 2015, the contents of both of which are incorporated herein by reference.

BACKGROUND OF THE INVENTION

Energy production plants have spread enormously due to the recent availability of technology that allows the construction of plants of any size and powered by renewable sources, particularly the sun, wind and water, and to the presence of strong economic incentives.

In recent years, starting from 2006, a strong incentivization has stimulated the construction of the same and many people have invested capital whose return is a function of the plant yield. A fall in production or performance other than expected means putting the investment at risk.

All payments, whether the mere sale of energy or incentive, are related to the measurement of the energy carried by the production meter certified and installed by the energy provider, and whose values are electronically sent to the offices of the same. Said meter is the instrument designed to the measurements on which said payments are based.

Devices exist on the market which measure the energy produced by the plant continuously and which send alerts in case of a severe drop in the energy produced, but which do not allow knowing the data detected by the meter and used by the energy provider, available initially only to them and by them then sent to those who manage the incentives, GSE in Italy. The latter provides the data on a restricted access portal on a monthly basis to the owner of the plant or its designee.

Moreover, the devices on the market, by measuring the energy only from the moment they have been put into operation, if not activated upon the plant start up, do not allow in any way the analysis of the plant operation over time as they do not have the historical production data, thus making it impossible to identify non-destructive faults and verify the performance of energy over time, since the basic reference value is lacking.

DISCLOSURE OF THE INVENTION

The object of the present invention is to automatically check the performance of energy of photovoltaic solar and wind plants based on historical data also since the plant start up, monitor the operation of the same and automatically generate reports of the checks and automatic alarms and alerts based on said performance.

The invention allows verifying the performance of energy over time of any photovoltaic or wind solar plants whose value of energy produced is made available on computers accessible through a public data communication network and monitoring the operation thereof.

The performance of energy is verified by comparing the plant production values of an even long past period of time up to the start of the system, with the current ones, even if the amount of energy produced has never been measured by its user in the past.

The technical problem of calculating the performance of plants referred to the initial start up values and in the past operation time of the plant itself, the automatic processing of numerous physical data, the automatic production of reports for technical and information purposes, the sending of alarms and alerts on the performance decay, is solved by the invention.

The energy production values over time (even from the plant start up) are collected by computers connected to the Internet public network which present them in a hypertext structure of accessible documents, the current ones from an energy meter inserted downstream of the plant and the historical and current weather ones from computers also connected to the Internet public network.

The result obtained by the system is the automatic production, i.e. in almost zero processing time, of operating reports that include the energy produced, the revenues and a performance index over time with energy performance measurements, graphs, analysis and alerts of photovoltaic solar and wind plants.

Such objects as well as others which will become apparent hereinafter are achieved by combining the measurement of the energy produced by the plant with sensors applied thereon, the values read by the energy provider when starting the plant and the estimated production obtained from the weather data.

BRIEF DESCRIPTION OF THE DRAWINGS

Further features and advantages of the invention will appear more clearly from the description of a preferred embodiment, shown by way of non-limiting example in the accompanying drawing, in which:

FIG. 1: shows a block diagram of the invention in the section "System object of the invention", generalizing the connection mechanisms between the parts. The upper section of the FIGURE shows elements of the external world to the invention.

DESCRIPTION OF A PREFERRED EXAMPLE OF INVENTION

With reference to FIG. 1, a preferred example of the invention is shown.

The object of the invention can be subject to changes and variations, all falling within the inventive concept described in the claims. The details may be replaced by other technically equivalent elements and the materials may be different depending on the needs without departing from the scope of protection of the invention.

An amperometric clamp (9) is located downstream of the production plant (1), on the wires that supply the energy to the grid. Optionally, meaning that it is not essential for the operation of the invention but which in some cases might give more accurate results, the signal containing the data transmitted is collected the standard way by the serial ports of the plant inverters. An inverter is a device that converts electrical energy in the form of direct current into alternating current with characteristics suitable for being supplied to the grid. Inverters are present in all photovoltaic plants and in some types of wind and hydraulic turbines.

The current value measured by the clamp (9) and/or the digital data collected from the ports is entered into a transmission device (4) which transmits the data to a computer (5) by means of a receiving device (3).

The data from the transmission device (4) to the reception device (3) is transmitted in any of the following ways, all possible separately:
- via Wi-Fi to a router connected to the Internet 15 and located in the vicinity of the plant
- via Ethernet to an Internet connection
- via LoRa long range transmission systems and connection to the Internet 15
- via a "SmartMesh" network and connection to the Internet 15
- via Wi-Fi with low power devices implementing the 6LoWPAN standard and the IEEE 802.15.4 protocol or the SIGFOX technology, including through the implementation of a SmartMesh network and connection to the Internet 15.

The computer (5) receives the data and performs calculations and produces the result. The computer (5) also periodically gathers from a computer (10) of the GSE, i.e., the energy provider, plant production data and payments made, values available in the plant owner account and of those authorized by them.

With the first access it gathers all the historical values since the plant start up.

The gathering of data is done by authorization of the same owner and delivery of the login passwords.

The processor (5) also collects the values radiation and/or wind speed and, if necessary, temperature and other weather parameters from computers (11) and (12) of satellite and terrestrial weather data providers.

With the data available, the computer (5) creates diagrams and tables to make the plant yield, produced energy values, incentives paid with amounts and dates, plant efficiency, clear.

Given the expected energy value calculated due to the availability of the resource value known by the weather data, the time performance of the plant is calculated as the ratio of hourly energy measured by the device at the plant on the expected energy value. The monthly performance is calculated as the ratio between energy measured by the meter read by the computer (10) of the GSE and the expected energy. The monthly performance value is compared with the average hourly performance for a comparison of the proper functioning of the official meter—provider—GSE chain.

Calculations are then applied to obtain the historical performance analysis of the plant, thus allowing the evaluation of any performance degradation and, more generally, the performance over time.

The result of the calculations is made available on the electronic processor (7) and collected by the device (8), which will display it on a led screen and allow access via browser or software application. The server will also generate a report that will be transmitted to the parties concerned.

The description therefore relates to an automatic system to check the performance of energy over time and monitor photovoltaic or wind power plants, which do not necessarily have an energy meter installed by the user, connected to the grid whose production data is read by a meter installed by the energy provider and whose energy measurement values are made available on a hypertext structure of documents that are accessible and reside on computers connected to the Internet network, comprising:

a. an energy meter produced by the plant, part of the system, installed upstream of the plant
b. a means of transmission and processing coupled to said meter
c. a results display device for monitoring and verification
d. a central processor which:
  i. collects the energy data produced by said hypertext structure of documents
  ii. collects meteorological data from services residing on computers connected to the Internet network
  iii. processes the data received and collected.

The system performs the automatic production of historical production reports of the photovoltaic plants, the production is the result of the above processing.

Moreover, the system and respective method processes an expected energy value, calculated from the value of the resource, known from the weather data, so as to calculate the monthly and hourly performance in relation to said expected energy value, carry out historical performance analysis of the plant and obtain production evaluations over a large time frame, by which degradations or faults may be identified, and provide one or more tables and/or report of the data produced that include the performance calculation.

The method then involves producing an analysis of efficiency of the plants using historical data obtained from automatic readings compared to precise values obtained from an energy meter downstream and meteorological data obtained automatically through Internet connection and access.

The system can also work without energy meter downstream of the plant to produce historical efficiency analyses of the plants using data obtained from automatic readings from computers connected to the public telecommunications network the Internet.

The system and method sends failure alarms of the plant generated when the parameters resulting from monitoring, compared with the results of the check made by the system, deviate from a predefined threshold.

The system performs the automatic reading of the energy values produced by the production plants and made available the on public or private access of computers connected to the Internet by management entities, such as the Electrical Services Provider (GSE) or ENEL Distribuzione.

The production of energy production reports, performance of the plants compared to the economic values with the automatic reading of the economic values associated with the production of energy produced by the production plants, made available for public or private access from computers connected to the network by entities acquiring the measurements from meters, the Internet by the Electrical Services Provider (GSE) or ENEL.

The transmission device consists of a device with a low consumption, preferably, it implements the 6LoWPAN standard and the IEEE 802.15.4 protocol, also through the implementation of a "mesh" network.

The transmission device consists of a long-range, LoRa type device.

INDEX OF REFERENCES USED IN THE TABLES

1—photovoltaic solar plant
2—produced energy meter
3—energy measurement receiver device
4—energy measurement transmitter device
5—computer
6—public data transmission network
7—computer
8—display device 9—clamp
10—service management entity's computer
11—weather and satellite's computer
12—weather service's computer
13—weather stations
14—satellite

The invention claimed is:

1. A method for verification of performance in energy over time, and monitoring of photovoltaic and wind power plants, the method comprising
   a. acquiring, automatically through connection and access via the Internet or through automatic readings,
      i. historical data of energy performance of the plants, and
      ii. satellite and terrestrial weather data of values of one or more weather parameters selected from the group consisting of radiation, wind speed and temperature;
   b. acquiring precise values of plant production in real-time through the Internet, using an amperometric clamp located downstream of the plant, on wires that supply energy to the plant,
   c. processing of an expected energy value calculated from a resource value, taken from the weather data,
   d. calculating hourly and monthly output in relation to said expected energy value,
   e. performing historical performance analysis of the plant and achievement of large scale time production assessments, through which drops or faults can be identified, and
   f. providing one or more tables and/or reports of the data produced including the calculation of performance;
   wherein said historical data of energy performance of the plants and said precise values of plant production are acquired by automatic reading through connection and access via the Internet of historical data and precise values which are provided on public or private access of computers connected to the Internet acquired from measurements from meters; and
   wherein an hourly performance of the plant is a precise ratio of energy with respect to an expected energy value; monthly performance is the ratio between energy value gained from historical data and expected energy value;
   further comprising comparing monthly performance value with the hourly performance average, and assessing a proper operation of the meter-supplier-electricity services provider chain.

2. The method of claim 1, further comprising sending plant malfunction alarms when parameters resulting from monitoring and verification deviate from an established threshold.

3. A method for verification of performance in energy over time, and monitoring of photovoltaic and wind power plants, the method comprising
   a. acquiring, automatically through connection and access via the Internet or through automatic readings,
      i. historical data of energy performance of the plants, and
      ii. satellite and terrestrial weather data of values of one or more weather parameters selected from the group consisting of radiation, wind speed and temperature;
   b. acquiring precise values of plant production in real-time through the Internet, using an amperometric clamp located at an output of an inverter,
   c. processing of an expected energy value calculated from a resource value, taken from the weather data,
   d. calculating hourly and monthly output in relation to said expected energy value,
   e. performing historical performance analysis of the plant and achievement of large scale time production assessments, through which drops or faults can be identified, and
   f. providing one or more tables and/or reports of the data produced including the calculation of performance;
   wherein said historical data of energy performance of the plants and said precise values of plant production are acquired by automatic reading through connection and access via the Internet of historical data and precise values which are provided on public or private access of computers connected to the Internet acquired from measurements from meters; and
   wherein an hourly performance of the plant is a precise ratio of energy with respect to an expected energy value; monthly performance is the ratio between energy value gained from historical data and expected energy value;
   further comprising comparing monthly performance value with the hourly performance average, and assessing a proper operation of the meter-supplier-electricity services provider chain.

4. The method of claim 3, further comprising sending plant malfunction alarms when parameters resulting from monitoring and verification deviate from an established threshold.

\* \* \* \* \*